US008648253B1

(12) United States Patent
Woods et al.

(10) Patent No.: US 8,648,253 B1
(45) Date of Patent: Feb. 11, 2014

(54) MACHINE AND PROCESS FOR CONTINUOUS, SEQUENTIAL, DEPOSITION OF SEMICONDUCTOR SOLAR ABSORBERS HAVING VARIABLE SEMICONDUCTOR COMPOSITION DEPOSITED IN MULTIPLE SUBLAYERS

(75) Inventors: Lawrence M. Woods, Littleton, CO (US); Joseph H. Armstrong, Littleton, CO (US); Richard Thomas Tregfio, Thornton, CO (US); John L. Harrington, Colorado Springs, CO (US)

(73) Assignee: Ascent Solar Technologies, Inc., Thornton, CO (US)

( * ) Notice: Subject to any disclaimer, the term of this patent is extended or adjusted under 35 U.S.C. 154(b) by 450 days.

(21) Appl. No.: 12/899,446

(22) Filed: Oct. 6, 2010

Related U.S. Application Data

(63) Continuation of application No. 12/896,690, filed on Oct. 1, 2010, now abandoned.

(51) Int. Cl.
*H01L 25/18* (2006.01)
*H01L 31/0264* (2006.01)
*H01L 31/0272* (2006.01)
*H02N 6/00* (2006.01)

(52) U.S. Cl.
USPC ........... 136/262; 136/243; 136/252; 136/264; 136/265

(58) Field of Classification Search
USPC .......................... 136/262, 243, 252, 264, 265
See application file for complete search history.

(56) References Cited

U.S. PATENT DOCUMENTS 6,048,442 A    4/2000    Kushiya et al.
(Continued)

FOREIGN PATENT DOCUMENTS

WO    WO 2009033503 A1 *    3/2009
WO    WO 2010110467 A1 *    9/2010

OTHER PUBLICATIONS

"Optical and Quantum Efficiency Analysis of (Ag,Cu)(In,Ga)Se2 Absorber Layers", 2009, Jonathan Boyle, Gregory Hanket, and William Shafarman.*
"Characterizing the effects of silver alloying in chalcopyrite CIGS solar cells with junction capacitance methods", 2009, Peter T. Erslev, Gregory M. Hanket, William N. Shafarman, and J. David Cohen.*
"Status of Polycrystalline Bolar Cell Technologies", 1991, Vijay K. Kapur and Bulent M. Basol.*

(Continued)

*Primary Examiner* — Jennifer Michener
*Assistant Examiner* — Mayla Gonzalez Ramos
(74) *Attorney, Agent, or Firm* — Lathrop & Gage LLP (57) ABSTRACT

A method of manufacture of I-III-VI-absorber photovoltaic cells involves sequential deposition of films comprising one or more of silver and copper, with one or more of aluminum indium and gallium, and one or more of sulfur, selenium, and tellurium, as compounds in multiple thin sublayers to form a composite absorber layer. In an embodiment, the method is adapted to roll-to-roll processing of photovoltaic cells. In an embodiment, the method is adapted to preparation of a CIGS absorber layer having graded composition through the layer of substitutions such as tellurium near the base contact and silver near the heterojunction partner layer, or through gradations in indium and gallium content. In a particular embodiment, the graded composition is enriched in gallium at a base of the layer, and silver at the top of the layer. In an embodiment, each sublayer is deposited by co-evaporation of copper, indium, gallium, and selenium, which react in-situ to form CIGS.

5 Claims, 6 Drawing Sheets (56) References Cited

U.S. PATENT DOCUMENTS

| | | | |
|---|---|---|---|
| 6,323,417 | B1 | 11/2001 | Gillespie et al. |
| 6,372,538 | B1 | 4/2002 | Wendt et al. |
| 6,974,976 | B2 | 12/2005 | Hollars |
| 7,374,963 | B2 | 5/2008 | Basol |
| 7,544,884 | B2 | 6/2009 | Hollars |
| 7,560,641 | B2 | 7/2009 | Menezes |
| 7,576,017 | B2 | 8/2009 | Tuttle |
| 2006/0207644 | A1 | 9/2006 | Robinson et al. |
| 2007/0093006 | A1 | 4/2007 | Basol |
| 2007/0227633 | A1 | 10/2007 | Basol |
| 2008/0093221 | A1 | 4/2008 | Basol |
| 2008/0280030 | A1 | 11/2008 | Van Duren et al. |
| 2009/0020149 | A1 | 1/2009 | Woods et al. |
| 2009/0117684 | A1 | 5/2009 | Basol |
| 2009/0169723 | A1 | 7/2009 | Hanket et al. |
| 2009/0199895 | A1 | 8/2009 | Basol |
| 2009/0223551 | A1 | 9/2009 | Reddy et al. |
| 2009/0226717 | A1 | 9/2009 | Basol |
| 2009/0250722 | A1 | 10/2009 | Bruce et al. |
| 2009/0255467 | A1 | 10/2009 | Britt et al. |
| 2009/0255469 | A1 | 10/2009 | Britt et al. |
| 2009/0258444 | A1 | 10/2009 | Britt et al. |
| 2009/0258476 | A1 | 10/2009 | Britt et al. |
| 2010/0133093 | A1 | 6/2010 | MacKie et al. |

OTHER PUBLICATIONS

Final Office Action issued in related U.S. Appl. No. 12/701,449, dated Mar. 13, 2012, 11 pages.
Pre-Appeal Brief Conference Request filed in related U.S. Appl. No. 12/701,449, dated Jun. 8, 2012, 5 pages.
Notice of Allowance issued in U.S. Appl. No. 12/701,449, dated Feb. 20, 2013, 8 pages.
U.S. Appl. No. 12/771,590, Non-Final Rejection mailed Sep. 3, 2010, 13 pages.
U.S. Appl. No. 12/771,590, Response to Non-Final Rejection filed Sep. 9, 2010, 4 pages.
U.S. Appl. No. 12/771,590, Non-Final Rejection and Examiner Interview Summary Record mailed Oct. 19, 2010, 11 pages.
U.S. Appl. No. 12/771,590, Response to Non-Final Rejection filed Nov. 19, 2010, 6 pages.
Office Action issued in related U.S. Appl. No. 12/701,449, dated Aug. 8, 2011, 11 pages.
Response Office Action issued in related U.S. Appl. No. 12/701,449, dated Nov. 8, 2011, 10 pages.
Appeal Brief filed in related U.S. Appl. No. 12/771,590, dated May 16, 2011, 19 pages.
Notice of Allowance issued in related U.S. Appl. No. 12/771,590, Jul. 7, 2011, 9 pages.

\* cited by examiner

PRIOR ART

FIG. 1

PRIOR ART

MACHINE AND PROCESS FOR CONTINUOUS, SEQUENTIAL, DEPOSITION OF SEMICONDUCTOR SOLAR ABSORBERS HAVING VARIABLE SEMICONDUCTOR COMPOSITION DEPOSITED IN MULTIPLE SUBLAYERS

CROSS-REFERENCE TO RELATED APPLICATIONS

This application is a continuation of application Ser. No. 12/896,690 filed Oct. 1, 2010. This application is related to the material of U.S. patent application Ser. No. 12/771,590 filed Apr. 30, 2010, which is a continuation of U.S. patent application Ser. No. 12/701,449 filed Feb. 5, 2010, which claims benefit of priority to U.S. Provisional Patent Application Ser. No. 61/150,282 filed Feb. 5, 2009. Each of the aforementioned patent applications are incorporated herein by reference.

FIELD

The present application relates to methods and apparatus for depositing films of semiconductor and other materials in fabricating semiconductor devices such as photovoltaic devices.

BACKGROUND

A popular thin-film photovoltaic technology is called CIGS, which refers to a photovoltaic device having a p-type semiconductor photon-absorber layer containing at least Copper, Indium, Gallium, and Selenium and capable of generating electron-hole pairs upon absorbing photons. In a typical CIGS photovoltaic cell, a Copper-Indium-Gallium-diSelenide (CIGS) layer operates with a heterojunction partner layer to generate a photocurrent when exposed to light. The photocurrent is produced when minority carriers are attracted from the CIGS layer to the heterojunction partner layer. Additional layers, such as a substrate, top and back contact layers, passivation layers, and metallization, may be present in the cell for structural rigidity, to collect the photocurrent, minimize reflections, and protect the cell. CIGS cells may also be layered with photovoltaic devices of other semiconductor materials into a multijunction, layered, structure.

CIGS semiconductor thin film can be created by a variety of processes, both in vacuo and ex vacuo in nature. Deposition methods such as sputtering, co-evaporation, and combinations of sputtering and evaporation performed in vacuo have produced CIGS photon absorber layers with high demonstrated performance, but traditional means for fabricating absorber layer are perceived as slow and prone to defects. Both sputtering and evaporation may involve a reactive process to create the CIGS alloy film having desired stoichiometry. Slow fabrication speed can lead to high fabrication cost. Defects in an absorber layer can allow recombination of electron-hole pairs thereby reducing cell efficiency and increasing panel area required for a given electrical output. Further, defects may short-circuit part or all of the photocurrent, impairing function of individual photovoltaic cells and modules made from such cells. Defects therefore reduce manufacturing yield and increase fabrication cost for cells and systems.

Some methods of creating a CIGS absorber layer deposit CIGS directly. Other methods deposit precursor sublayers, such as layers of copper, layers of indium and gallium, and layers of selenium, that are reacted in-situ to form CIGS. Delivery of either CIGS, or the precursor sublayers, can be performed by a single source, or by a plurality of sources. Existing processes typically require that the cell remain in a deposition zone for a lengthy time to deposit and form an absorber layer of the desired thickness.

Many defects in CIGS solar-absorber layers initiate at the surface of the underlying contact layer when the elements are initially disposed on the surface; these defects originate at the bottom of the CIGS absorber layer. Defects originating at the bottom of the layer may propagate through the entire layer. Growing CIGS films to the desired thickness without termination can allow these defects to propagate through the thickness of the film; defects extending through the thickness of the film are particularly prone to cause short-circuit defects because later deposited layers may contact layers underlying the CIGS layer.

Traditional in vacuo processing of semiconductor materials is batch-oriented. Substrates and source materials are placed in a chamber, air in the chamber is pumped out, deposition is performed, air is allowed back into the chamber after deposition is completed, and the substrates are moved to further processing stations or deposition sources in the chamber are replaced in preparation for following steps. In order to reduce cost of photovoltaic cells by increasing the area of cell produced with each pumping cycle of the chamber, there is much interest in roll-to-roll processing. In roll-to-roll processing, substrate of a feed roll is unrolled within the chamber, passed through at least one deposition and reaction zone, and wound onto a take-up roll after passing through the deposition and reaction zone. In roll-to-roll processing, there is economic advantage in maintaining high substrate transport speed through the deposition zone. High substrate speed through a deposition zone while reaching a desired film thickness requires either an extended deposition zone length or a rapid deposition rate of the film.

Increasing deposition rates of traditional in vacuo CIGS deposition processes typically requires larger size or larger quantity of sources, or both, but the basic sequencing of deposition is typically unchanged and propagation of defects through the entire thickness of the CIGS layer may be enhanced at high deposition rates. Defects propagating through the entire thickness of CIGS that cause the short-circuit defects are particularly critical to large-area CIGS modules formed by monolithic integration. Unlike modules made with discrete cells that are sorted to match performance prior to module integration, a monolithically integrated module is processed from a contiguous section of photovoltaic material, and any defect contained therein can severely affect the performance of that module.

Aluminum is in the same column of the periodic table as Gallium and Indium, Aluminum therefore has some similar chemical properties to Gallium and Indium and these three elements can be considered as forming a group; these three elements are classed as group IIIB in the periodic table. Similarly, Sulfur and Tellurium are in the same column as Selenium and have some similar chemical properties; these three elements can be considered as forming a group and are classed as group VIB in the periodic table. Silver and Gold are in the same column as Copper, have some similar chemical properties to Copper, and can also be considered as forming a group, these elements are classed as group IB in the periodic table. Group Ib-IIIb-VIb semiconductors as described herein typically have a chalcopyrite crystal structure having two parts VIb atoms for one part group Ib and one part group IIIb. While each element in these groups has some similar chemical properties to the other elements of the group, they also have significant physical, electronic, and chemical differences, which influence the physical, electronic and chemical compounds formed with them.

CIGS is classified, along with many other materials, as a IB-IIIB-VIB compound semiconductor material because of the periodic table groupings of its constituent elements.

SUMMARY

Materials used in the fabrication of a photovoltaic device having an semiconductor absorber layer are disposed as thin films onto a supporting substrate material.

The present approach for depositing an absorber layer involves depositing the multiple elements of IB-IIIB-VIB semiconductor in such a way as to create a series of sequential absorber sublayers, each of which is of notably less than the desired total thickness. In an embodiment, the sublayers are of substantially identical composition. In an alternative embodiment, the sublayers have graded composition in one or more of the constituent elements. In another embodiment, the first sublayer is specifically designed for reducing back contact recombination velocity, thereby promoting efficiency. In another embodiment, the last sublayer is specifically designed for reducing defects in the junction region. In an embodiment, the deposition of each sublayer is performed in vacuo, confined to an area referred to as a 'zone', using physical vapor deposition sources such as sputter and evaporation sources for each of the four or more elements in a deposition zone associated with deposition of the sublayer. Each deposition zone may also incorporate a reactive or annealing process to create CIGS alloy film having desired stoichiometry. Multiple deposition zones are provided, one deposition zone for each sublayer deposited.

This approach, as discovered, presents improvement over prior art in four ways.

First, this approach can accommodate virtually any existing process that creates an IB-IIIB-VIB solar absorber, and is particularly adaptable to roll-to-roll processing. In roll-to-roll processing, the substrate is unrolled from a feed spool, moves through the multiple deposition zones sequentially, and is wound onto a takeup spool. Each zone can be defined by the direct fabrication of the IB-IIIB-VIB material, or as sublayers that are later reacted to form the IB-IIIB-VIB material.

Second, since each of the deposition zones creates a film with a notably lower thickness than the total desired, the transport speed of the substrate through each zone can be higher than if that zone were required to produce the entire solar absorber film thickness.

Third, by utilizing several sublayers, the growth of each being terminated prior to reaching the total desired thickness, it is less likely that defects will propagate through the total thickness of the resultant absorber layer, thereby presenting a final absorber film with fewer short-circuit defects.

This approach provides the ability to adjust the chemistry in individual absorber sublayers in order to produce an overall absorber layer film with specifically designed properties. These properties may include gradients of the elements through the total thickness of an IB-IIIB-VIB absorber layer and consequential gradients in electrical and physical properties. These properties may include gradients of other alloying elements within a CIGS absorber, such as aluminum substituting for some of the gallium or indium, silver substituted for some or all of the copper, or tellurium or sulfur substituted for some or all of the selenium. These gradients can enhance the conversion efficiency of the photovoltaic device of which the absorber layer is a part.

There are other compound semiconductor materials, such as III-V, II-VI, II-V, I-VI, and IV-VI, some of which have important uses in industry. The present processing approach may be adaptable to manufacture of films of such materials.

DETAILED DESCRIPTION OF THE EMBODIMENTS

Figure 1:
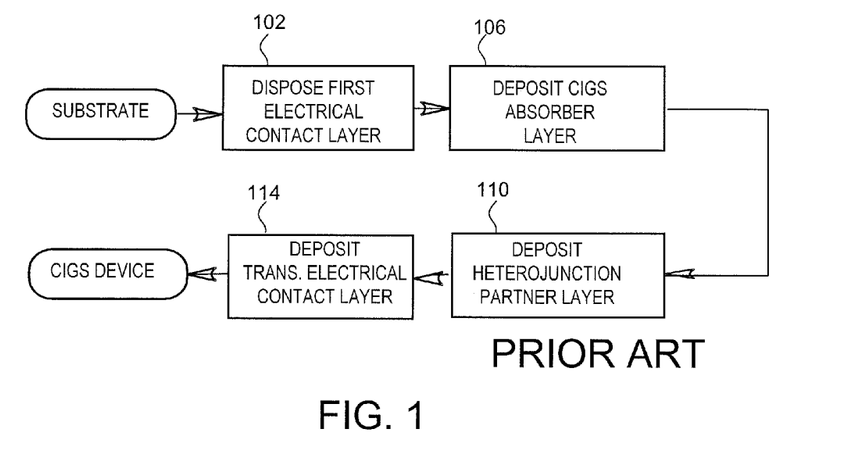
FIG. 1 is a flowchart of a generic fabrication for a PRIOR ART thin-film photovoltaic (PV) device based on the CIGS absorber technology.

FIG. 1 illustrates a generic fabrication process for a thin-film photovoltaic (PV) device based on the IB-IIIB-VIB semiconductor CIGS (Copper-Indium-Gallium-Selenide) absorber technology, consisting of a sequence of individual process steps as known in the art. A substrate 150 (FIG. 1A) is used as the base for all subsequently-deposited thin films. Such a substrate may be rigid or flexible, may be an insulator or conductor, and may incorporate additional layers already deposited on it. An electrically-conductive or contact layer 152 is deposited in a deposition step 102 onto the substrate material 150 to serve as a back contact to the photovoltaic absorber. The contact layer 152 deposited in step 102 may incorporate metals, semiconductors, or conductive oxides. In one embodiment, the contact layer is molybdenum metal. A p-type, IB-IIIB-VIB compound semiconductor typically containing at least copper, indium, gallium, and selenium, often referred to in the industry as Copper-Indium-Gallium-DiSelenide (CIGS) 154, is deposited over the contact layer 152 in step 106. This process may include both nonvacuum and vacuum-based deposition technologies. Known vacuum-based processes for deposition 106 of CIGS include evaporation, plasma-assisted evaporation, sputtering, and reactive sputtering.

Figure 1A:
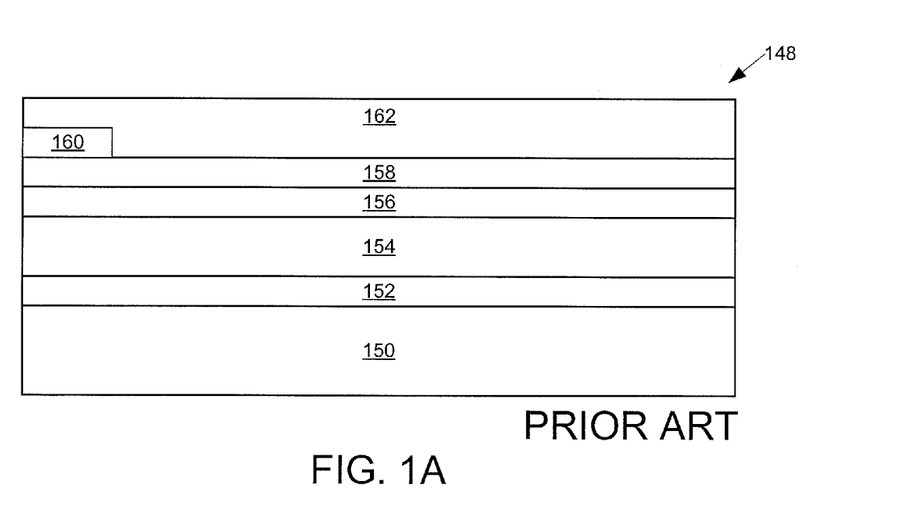
FIG. 1A is a cross section of a PRIOR ART photovoltaic cell such as may be made by the process of FIG. 1.

Once CIGS absorber layer 154 is deposited, an n-type heterojunction partner layer 156 is deposited 110 onto the substrate/contact/CIGS stack. This process may be either nonvacuum or vacuum based, and may include Cadmium Sulfide or other suitable semi-conductive-oxide materials.

The materials deposited must be suitable to form the desired electrical interface with the CIGS film. An optional intrinsic or semiconducting layer may be deposited over the heterojunction partner layer 156 as a buffer layer, and may include Zinc-Oxide or other suitable semi-conductive-oxide materials. Next, a transparent conductive oxide contact layer 158 is deposited 114 onto the substrate/contact/CIGS/heterojunction partner/buffer layer stack. Again, this process may be either nonvacuum or vacuum based, and may include one or more films of transparent oxides, transparent conductive oxides, and transparent conductive polymers. The contact layer 158 is typically made of a material transparent to at least some wavelengths absorbable by the CIGS layer to facilitate transmission of light to the CIGS layer to facilitate the desired photovoltaic energy conversion process.

Additional conductive layers such as a top metallization layer 160, and a passivation layer 162, or even another photovoltaic cell, may be deposited over the contact layer 158, and patterning and interconnect steps may also be performed to provide a monolithically integrated device. The result of the process described in FIG. 1 is a photovoltaic device 148 based on the CIGS absorber layer 154.

The order of steps in the process of FIG. 1 could be varied, such as to form alternate photovoltaic device configurations as known in the art. For example, the process of FIG. 1 could be inverted such that a transparent contact layer is formed on a transparent substrate, a heterojunction partner layer is formed on the transparent contact layer, a CIGS layer is formed on heterojunction partner layer, and a back-contact layer is formed on the CIGS layer.

Figure 2:
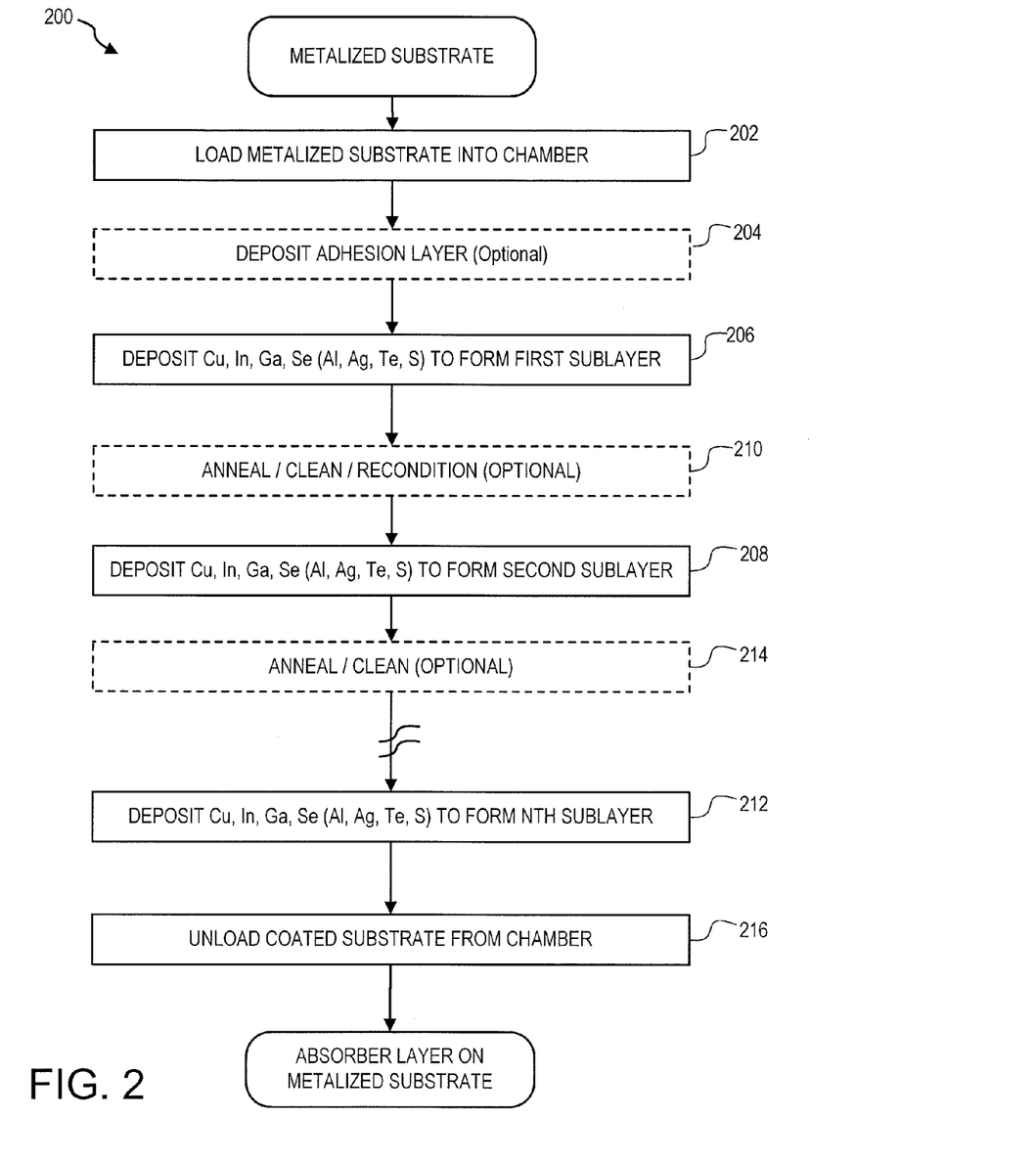
FIG. 2 is a flowchart of a process for creating absorber layers by depositing multiple sublayers in contact with each other.
Figure 2A:
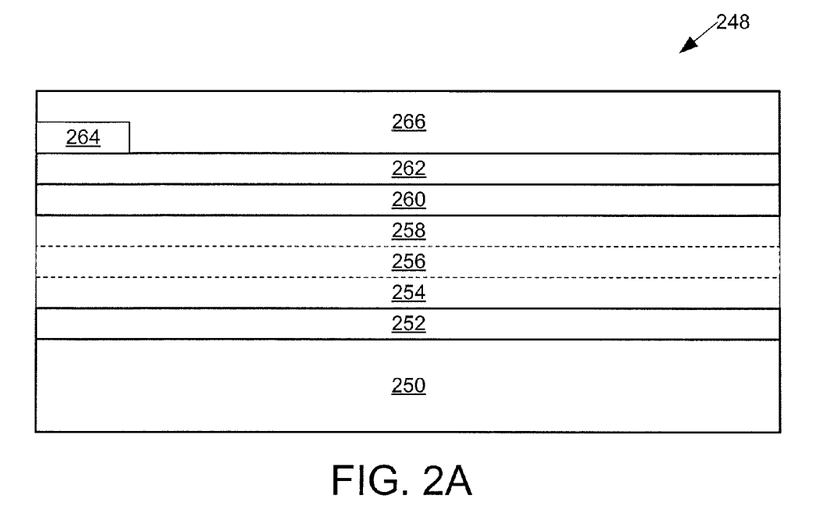
FIG. 2A is a cross section of a photovoltaic cell such as may be made by the improved process of FIG. 2.

FIG. 2 represents a process 200 for depositing a CIGS absorber layer according to the present invention. FIG. 2A is a cross sectional diagram of a CIGS PV cell 248 made according to the process of FIG. 2. A substrate 250/contact metal 252 stack, or metalized substrate, is loaded 202 into a machine and exposed to a vacuum. Alternatively, the substrate may be fabricated of conductive metal and serve as a back contact metal layer.

The substrate 250/contact metal 252 stack is fed into an optional zone where an adhesion layer (not shown in FIG. 2A) may be deposited 204 on the substrate 250/contact metal 252 stack. The substrate 250/contact metal 252 stack is then fed along a substrate path into a first deposition zone where a first sublayer of CIGS 254 is deposited 206 on the substrate 250/contact metal 252 stack. The substrate 250/contact metal 252 stack is then fed into a second deposition zone where a second sublayer of CIGS 256 is foamed 208 on the substrate 250/contact metal 252 stack. In an embodiment, an annealing and cleaning step 210 may be interposed between deposition 206 of the first sublayer of CIGS 254 and deposition 208 of the second sublayer of CIGS 256 to provide an optimum opportunity for the second sublayer 256 of CIGS to seed and fill defects in the first sublayer of CIGS 254. In a particular embodiment, cleaning is performed by a plasma etch station interposed along the substrate path.

Each sublayer 256, 254 of CIGS forms part of an overall absorber layer of CIGS throughout which are generated electron-hole pairs in response to photons of electromagnetic energy of sufficient energy incident thereon. In certain embodiments, each sublayer has a same or an approximately same composition. In other embodiments, the compositions of two or more sublayers differ such that the solar absorber layer has a composition that is graded in at least one elemental concentration from at least one sublayer, such as sublayer 256, to another sublayer, such as sublayer 254, of the absorber layer. In some embodiments, each sublayer has a same thickness, while in other embodiments, at least two sublayers have different thicknesses.

Additional zones for deposition of additional sublayers of CIGS may be provided. In an embodiment, the substrate 250/contact metal 252 stack is next fed into a third deposition zone where a third sublayer of CIGS 258 is deposited 212 on the substrate 250/contact metal 252 stack. In an embodiment, an annealing and a cleaning step 214 may be interposed between deposition 208 of the second sublayer of CIGS 256 and deposition 212 of the third sublayer of CIGS 258.

Additional zones, such as a fourth, fifth, etc. zone for deposition of additional sublayers of CIGS may also be provided in some embodiments. In certain embodiments, each deposited CIGS sublayer, if of sufficient thickness, is stoichometrically complete and would itself be suitable for use as a p-type semiconductor solar absorber layer in a photovoltaic cell without requiring any additional processing of the solar absorber sublayer. For example, in some embodiments, each deposited CIGS sublayer is reacted by heat or light to complete formation of CIGS of the sublayer prior to depositing the next CIGS sublayer such that each CIGS sublayer is effectively a p-type semiconductor solar absorber sublayer capable of generating electron-hole pairs in response to photons of electromagnetic energy of sufficient energy incident thereon. In the context of this disclosure and claims, individually reacted means each solar absorber sublayer is reacted independently, or substantially independently, from each other solar absorber sublayer.

In alternate embodiments, one or more of the deposited sublayers are formed of a IB-IIIB-VIB semiconductor other than CIGS such as Copper-Indium-DiSelenide (CIS) material, a Silver-Copper-Indium-Gallium-Selenide (ACIGS), a Copper-Aluminum-Indium-Gallium-Selenide (CAIGS), Copper-Indium-Aluminum-Telluride (CIAT) material, or an alloy of a CIS material other than CIGS; such alloy layers may be combined with CIGS sublayers to form a composite absorber layer having a graded composition.

Once a sufficient total thickness of CIGS or other IB-IIB-VIB material has been deposited and alloyed, the resulting substrate 250/contact metal 252/CIGS 254 256 258 stack is passed to further zones for additional processing, or unloaded 216 from the machine for continued processing steps 110 and 114. For example, once a sufficient total thickness of CIGS has been deposited, heterojunction partner layer 260, optional buffer layer (not shown), contact layer 262, top metallization layer 264, and passivation layer 266 are deposited to form a complete photovoltaic cell.

Figure 3A:
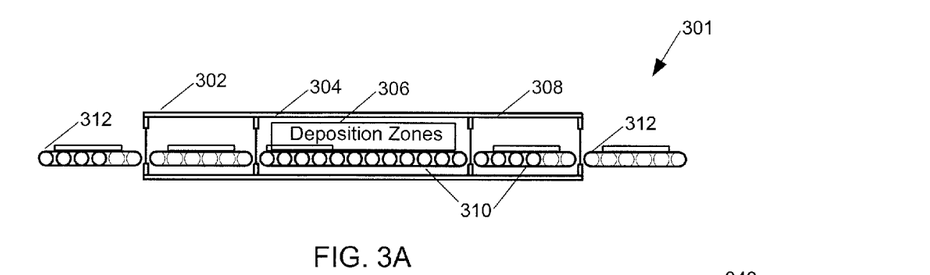
FIG. 3A is a diagram of a machine for carrying out the process of FIG. 2 on individual substrates.

FIG. 3A represents an embodiment of a machine for performing the process of FIG. 2. Machine 301 represents an inline approach for depositing CIGS suitable for either metalized rigid or flexible substrate. The vacuum system has three separate areas, an entry loadlock 302, a process chamber 304 that houses the at least two deposition zones 306, and an exit loadlock 308. In order to preserve vacuum in the process chamber 304, a series of valves are placed in between the entrance loadlock 302 and process chamber 304, and the process chamber 304 and the exit loadlock 308, respectively. Systematic operation of the valves allow the material to enter the vacuum process chamber 304, have CIGS or another material disclosed herein deposited onto it in a plurality of sublayers (e.g., 254, 256, 258 of FIG. 2A), and exit the chamber via the exit loadlock 308 without losing vacuum. The transportation of substrate through the system is facilitated by a series of transport mechanisms 310. Additional handling apparatus 312 may be provided to feed substrates into the system and to stack substrates exiting the system.

Figure 3B:
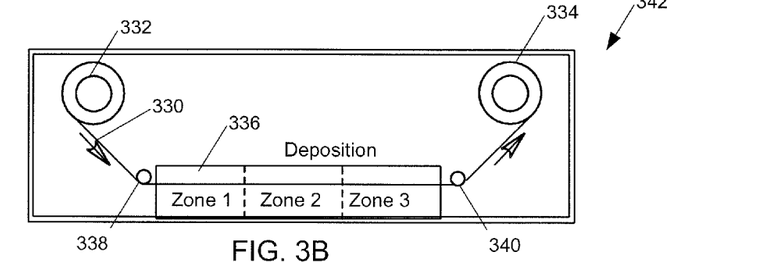
FIG. 3B is a diagram of a machine for carrying out the process of FIG. 2 on a continuous roll-to-roll substrate.

FIG. 3B illustrates another embodiment of a machine for performing the process of FIG. 2. Machine 342 represents a roll-to-roll approach, where the substrate 330 is necessarily flexible and is transported in a continuous web from a feed spool 332 to a take-up spool 334 through the multiple deposition zones 336. In this machine, a substrate 330 coated with the first metallic contact is placed in feed spool 332, and the substrate/contact is transported around a series of rollers 338 and 340 through the deposition zones 336. IB-IIIB-VIB material, such as CIGS, is deposited and alloyed in multiple sublayers (e.g., 254, 256, 258 of FIG. 2A) to the desired total thickness of an absorber layer, and the substrate/contact/absorber layer assembly then exits and is rolled up on a take-up spool 334. This embodiment typically takes place with the entire absorber layer deposition process occurring in vacuum, and typically in the same chamber. Flexible substrates 330 suitable for use with the machines of FIGS. 3B, 3C, and 6 include polyimide substrates and thin metallic foil substrates such as steel.

Figure 3C:
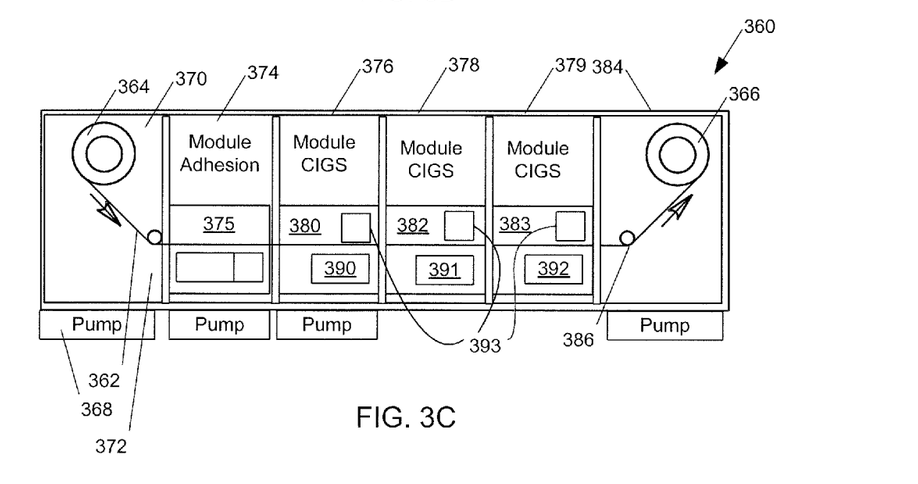
FIG. 3C is a diagram of a segmented machine for carrying out the process of FIG. 2 on a continuous, flexible, roll-to-roll, substrate.

Another embodiment of a machine 360 for performing the process of FIG. 2 is illustrated in FIG. 3C. This machine 360 is constructed from several independent specialized segments having couplers such that they may be coupled in series in various combinations and with varied numbers of deposition zones. Each segment has a portion of housing that, when the segments are coupled, forms part of the wall of the vacuum chamber of the machine. Airlock doors may optionally be provided at couplers of the segments such that substrate 362 may be loaded onto a feed spool 364, or coated substrate may be removed from a take-up spool 366, without admitting air to the entire machine 360. At least one, and optionally multiple, segments are equipped with vacuum pumps 368 to create and maintain vacuum in the machine 360.

A first segment or feed module 370 of the machine 360 contains the feed spool 364, and associated rollers 372, which transport a metalized substrate 362 along a substrate path through machine 360. An optional loading apparatus (not shown) may be provided for loading substrate 362 into the substrate path. In an embodiment, metalized substrate 362 on feed spool 364 is a flexible substrate 250 with a metal contact layer 252 already deposited upon it.

A second, optional, segment 374 of the machine may deposit an adhesion layer (not shown) in an adhesion layer deposition zone 375. Metalized substrate 362 then enters the first 376 of several absorber layer deposition segments 376, 378, 379. Each absorber layer deposition segment 376, 378, 379 has one or more IB-IIIB-VIB absorber-layer deposition zones 380, 382, 383. Each deposition zone 380, 382, 383 has source devices 390, 391, 392 for providing vapor and/or ions of each of the three, four, or more elements required to form a IB-IIIB-VIB absorber layer; in a particular embodiment source devices are provided for each of the four elements required to form a sublayer of CIGS—Copper, Indium, Gallium, and Selenium. Particular embodiments may have additional vapor and/or ion source devices for one or more of the additional IB-IIIB-VIB elements Silver, Aluminum, Sulfur, and Tellurium. The source devices are arranged such that the vapor and/or ions of the elements deposit upon a surface of the substrate as a compound of these elements. In an embodiment, each deposition zone 380, 382, 383 also has an energy source, such as an annealing heater 393 to control deposition and complete reacting the deposited material to form a IB-IIIB-VIB absorber sublayer such as a sublayer of CIGS; the first zone 380 forming a first absorber sublayer 254, the second zone 382 forming a second absorber sublayer 256, and the third zone 383 forming a third absorber sublayer 258.

At an output end of the machine 360, an output segment or output module 384 contains the take-up spool 366, and associated rollers 386 and apparatus as required for threading the substrate 362 through the substrate path and onto the take-up spool 366.

In alternative embodiments, additional segments or modules having additional deposition zones may be provided between the third zone 383 and the output segment 384.

Figure 4:
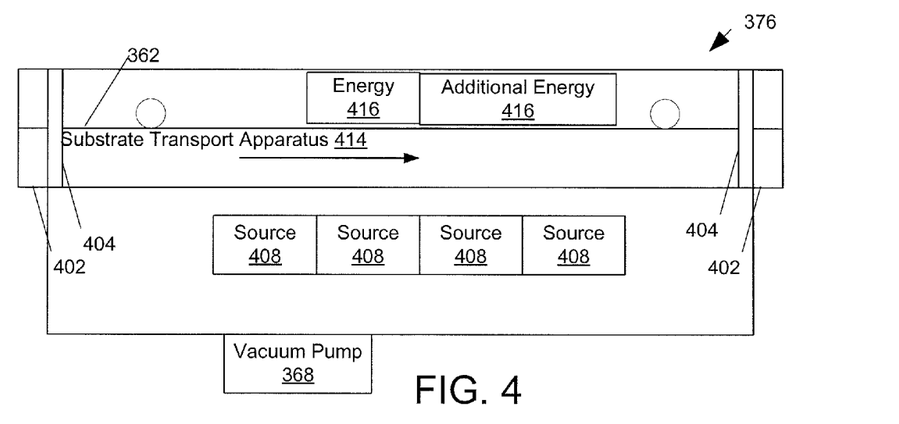
FIG. 4 is a diagram of an individual segment of the machine of FIG. 3C, or of an individual deposition zone of the deposition unit of FIG. 3B.

FIG. 4 illustrates a IB-IIIB-VIB absorber sublayer deposition segment 376, 378, 379 such as may be a component of machine 360. At each end of this segment 376, are couplers 402 that permit attachment of multiple segments 376 in series as shown in FIG. 3C. Baffles may optionally be provided as well such that undeposited vapor from segments of one type, such as adhesion layer deposition segment 374, does not unduly contaminate layers deposited by segments of another type, such as an absorber sublayer deposition segment 376. Doors 404 may optionally be provided at segment ends to permit loading or unloading of substrate into the first segment or the output segment without opening the entire machine to air. Within the segment 376 are one or more vapor source units 408 for each of the desired IB-IIIB-VIB absorber-layer sublayer's constituent elements, such as copper, selenium, indium, and gallium where the IB-IIIB-VIB sublayer is to be CIGS; each vapor source may operate through heating of an appropriate material or through sputtering of an appropriate material. Vapor from the source units collects and reacts to form a deposit on substrate 362 suspended near source units 408 by substrate transport apparatus 414.

In an embodiment, one or more sources of additional energy 416 source, such as a plasma energy source, an optical energy source, or a electric heat source, are provided for applying additional energy to the substrate as evaporated material condenses upon it; this helps influence deposit composition and grain formation and facilitates formation of the IB-IIIB-VIB absorber-layer alloy. In an embodiment, heaters 416 apply heat to a reverse side of the substrate 362. In an alternative embodiment, a further plasma cleaning device may be included in a zone to recondition the underlying surface of contact metallization 252 at defects in the first absorber-layer sublayer 254 and allow improved sealing of these defects by new grain formation at these defects of subsequent deposited absorber-layer sublayers 256, 258.

Each segment may contain more than one deposition zone, where each zone has vapor source units 408 for each of the three or more elements required to form a desired IB-IIIB-VIB absorber sublayer such as vapor source units for the elements selenium, copper, indium, gallium, silver, tellurium, sulfur, and aluminum, and an electric heater 416. The source units 408, substrate transport apparatus 414, and the additional energy 416 sources may be located in various locations within the machine to optimize material quality, substrate transport efficiency.

In an alternative embodiment, since selenium vapor spreads rapidly through the segment, a segment has a single vapor source unit 408 for selenium, and two deposition zones each having vapor source units 408 for each of copper, indium, and gallium with an alloying heater 416.

Each deposition zone within the deposition zones 306, 336 of the machines of FIGS. 3A and 3B also has at least one source for each of three to six elements selected from the elements copper, silver, indium, gallium, aluminum, sulfur, tellurium, and selenium as illustrated in FIG. 4 in order to carry out the process of FIG. 2.

In an embodiment of the machine of FIG. 3C, a first CIGS deposition segment 376 deposits a first sublayer 254 of CIGS that is somewhat enriched in copper, while later CIGS deposition segments 378 deposit a CIGS sublayer 256 unenriched in copper, and a subsequent CIGS deposition segment 379 may deposit a CIGS sublayer 258 slightly depleted in copper. The relative enrichment or depletion in copper is no more than a few percent—the sublayers 254, 256, 258 produced have substantially similar composition. This embodiment provides capability of producing a copper concentration that is graded across the total CIGS layer thickness as has been previously shown to enhance operating efficiency of CIGS photovoltaic cells.

In an embodiment of FIG. 3C, layer deposition segment 374 deposits 204 (FIG. 2) a very thin, adhesion-enhancing, layer onto the metalized substrate containing primarily indium, gallium or aluminum, and selenium or tellurium. The adhesion-enhancing layer serves also to provide preferential grain growth in the next-deposited sublayer 254 of IB-IIIB-VIB absorber, such as a CIGS sublayer, deposited in the subsequent step 206 carried out by CIGS segment 376. Alternatively, the adhesion-enhancing layer may serve to enhance adhesion of a back surface field sublayer, or a back contact interface sublayer; such back surface field sublayer will in turn be coated with additional absorber sublayers.

The machine of FIG. 3C may contain two, three, four, or more CIGS segments 376, 378, 379 and can therefore deposit from 2 to N sublayers deposited in N process steps, where N is an integer, with the resulting sublayer films combining to create the desired total thickness of CIGS film. In an embodiment, all of the absorber-layer sublayers disposed in absorber-layer segments 376, 378, 379 are predominantly CIGS in composition, and may or may not have different thicknesses.

Figure 5:
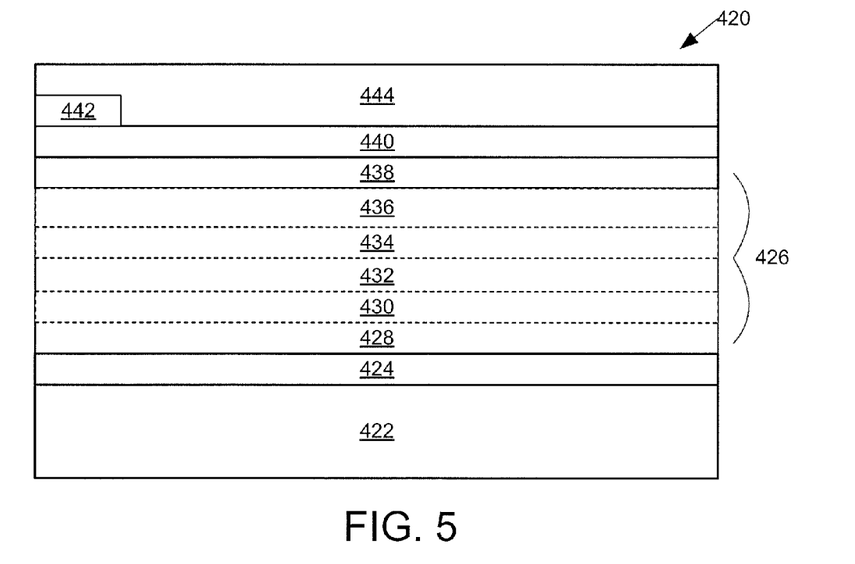
FIG. 5 is a cross section of a photovoltaic cell having graded composition and an absorber layer fabricated from multiple sublayers of materials.

An alternative photovoltaic cell configuration is illustrated in the cross section of FIG. 5. In this embodiment 420, a substrate 422 having a back contact layer 424, such as a layer of molybdenum, is coated with an IB-IIIB-VIB composite absorber layer 426. Within the absorber layer 426 is a CIAT (copper indium aluminum telluride) sublayer 428 adjacent to the back contact metal 424 blended with an adjacent sublayer 430 of intermediate CIGATS (copper indium gallium aluminum telluride selenide) composition. Sublayer 430 is adjacent to sublayers 432 and 434 of CIGS composition; sublayer 434 is adjacent to a sublayer 436 of AIGS (silver indium gallium arsenide) composition. It has been found that the CIAT sublayer tends to repel minority carriers away from the back contact 424 and towards heterojunction partner layer 438, while the AIGS sublayer tends to have fewer defects than CIGS thereby forming a more perfect, less recombination, junction between composite absorber layer 426 and heterojunction partner layer 438. Adjacent to AIGS sublayer 436 of absorber layer 426 is a heterojunction partner layer 438, typically of cadmium sulfide, then a transparent contact layer 440 of a transparent oxide such as zinc oxide or indium tin oxides, and, covering only parts of the cell, a low-resistance top-contact interconnect 442. Passivation layer 444 covers all except for a portion of low-resistance top-contact interconnect 442 to provide protection to the device.

In an alternative embodiment, an absorber layer is produced having graded composition with Aluminum replacing some or all of the stochiometric indium and gallium in some sublayers, and with silver replacing some or all of the copper in some sublayers.

Figure 6:
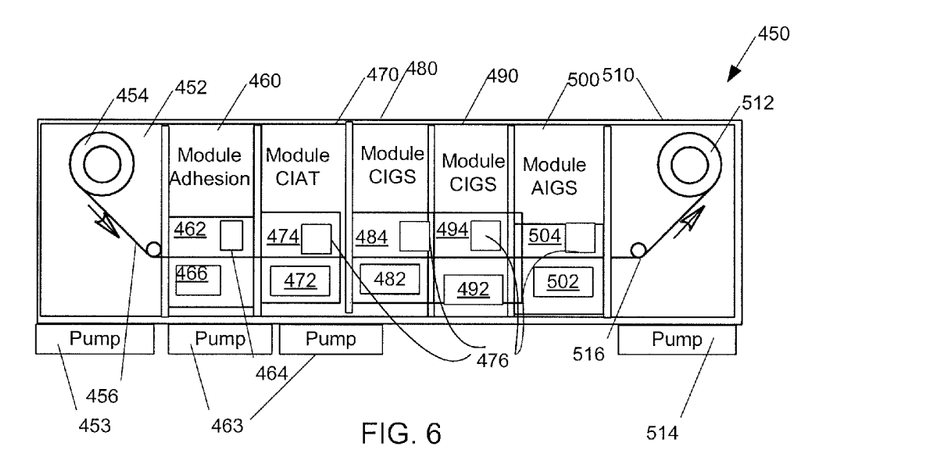
FIG. 6 is an illustration of a segmented machine for carrying out an embodiment of the process for making graded absorber layers on a continuous, flexible, roll-to-roll, substrate.

In order to produce the device of FIG. 5, a machine 450 as illustrated in FIG. 6 is used. The machine of FIG. 6 resembles that of FIG. 3C, and may embody physically compatible modules, such as substrate feed module 452. Feed module 452 has a vacuum pump 453 for evacuating the machine, substrate feed roll 454 and associated handling apparatus that provides a continuous feed of metalized substrate 456 to other modules of the machine.

Metalized substrate 456 passes from feed module 452 into and through an optional adhesion layer deposition module 460, a CIAT deposition module 470, multiple CIGS deposition modules 480, 490, an AIGS deposition module 500, and a take-up segment or module 510. Take-up segment or module 510 has a takeup roll 512 and appropriate handling apparatus, vacuum pump 514, and airlocks for collecting coated substrate 516, and collecting it on roll 512.

As substrate 456 is fed into and through machine 450, adhesion module 460, if present, deposits an adhesion layer (not shown) over back-contact metal layer 424 (FIG. 5) from appropriate sources 466 in first deposition zone 462, the layer may be annealed by heater 464.

The substrate 456 next enters a first absorber sublayer deposition module 470, having one or more sources for vapor and/or ions of each element in a desired first sublayer 428, in an embodiment the first sublayer is selected from CIGT, or CIGTS. In an alternative embodiment the first sublayer is CIGS. In some embodiments as many as six vapor or ion sources may be present in sources 472 of the deposition zone 474 of module 470 to permit production of an alloy containing six of the IB-IIIB-VIB elements Cu, Ag, In, Ga, Al, S, Se, Te. Further, one or more heaters 476 may be provided in module 470 for alloying and annealing the deposited sublayer.

In an alternative embodiment, sources for small ratios of one or more additional elements, including the Group JIB materials Cadmium and Mercury, that can substitute for group IB elements as dopants under some conditions may be provided to allow for fine adjustment of electrical properties. Similarly, in an alternative embodiment, sources for Boron and Thallium may be provided because these elements are group IIIB elements, and a source for trace amounts of Oxygen may be provided because this element has many chemical similarities to sulfur and selenium and can fit into the lattice. Since every IB-IIIB-VIB element other than oxygen can react with oxygen, including other group VI elements, excessive oxygen in the deposition zone must, however, be avoided to prevent formation of oxides instead of the chalcogenide alloy; one of the primary purposes of vacuum pumps 453, 514, 463 provided on many modules is to reduce and maintain oxygen levels below that of atmospheric air to permit evaporation or ion production of other IB-IIIB-VIB elements without excessive formation of such oxides. In some embodiments, Oxygen may also add to the lattice in a post-deposition air-anneal, where it tends to fill selenium vacancies.

The substrate 456 then moves through a second, third, and in some embodiments additional (not shown for simplicity) IB-IIIB-VIB absorber sublayer deposition modules 480, 490 having one or more sources for vapor and/or ions of each element in a desired second, third, and additional sublayers 430, 432, 434. In an embodiment these modules 480, 490 deposit CIGS. In some embodiments, as many as six vapor or ion sources may be present in sources 482, 492 of the deposition zone 484, 494 of module 480, 490 to permit production of an alloy containing from three up to six of the IB-IIIB-VIB elements Cu, Ag, In, Ga, Al, S, Se, and Te for each sublayer. Further, one or more heaters 476 may be provided in modules 480, 490 for alloying and annealing the deposited sublayer.

The substrate 456 then moves through a final IB-IIIB-VIB absorber sublayer deposition module 500 having one or more sources for vapor and/or ions of each element in a desired final sublayer 436, in an embodiment the final sublayer is CIGS and in alternative embodiments AIGS or ACIGS. In some embodiments as many as six vapor or ion sources may be present in sources 502 of the deposition zone 504, of module 500 to permit production of a sublayer of an alloy containing up to six of the IB-IIIB-VIB elements Cu, Ag, In, Ga, Al, S, Se, and Te, such as Silver-Copper-Indium-Gallium-Aluminum-Selenide (ACIGAS) or Silver-Copper-Indium-Gallium-Selenide-Sulfide (ACIGSS). Further, one or more heaters 476, lasers, or other sources of energy may be provided in module 500 for alloying and annealing the deposited sublayer, or, in an alternative embodiment lacking heaters in one or more other compartments, for alloying and annealing the entire absorber layer.

The coated substrate 516 then moves into take-up module 510 where it is wound on a roll 512. In an embodiment, the roll 512 is transported to a subsequent machine or machines for deposition of the heterojunction partner layer 438, top contact 440, metallization 442, and passivation 444; in an alternative embodiment, additional modules are provided between final absorber layer module 500 and take-up module 510 to perform one or more of these depositions. In various embodiments, etching or scribing steps, and other steps, may also be performed to segment the photovoltaic device into multiple cells, and to couple those multiple cells into series or series-parallel arrangements.

Although embodiments described above include moving a substrate through a number of deposition zones (e.g., moving the substrate in steps or moving the substrate continuously), one of ordinary skill will appreciate after reading and comprehending the present application, that the embodiments described herein are not limited to only this configuration.

For simplicity herein, layers are referred to as specifically CIGS, CIAT, ACIGS, or AIGS layers if they comprise primarily those elements; comprising primarily those elements for this purpose means that there is no more than five percent of other elements.

The machine illustrated with reference to FIGS. 3C and 6 is modular, and individual modules may be substituted with modules tailored for producing sublayers of particular Ib-IIIb-VIb semiconductor materials. In a particular embodiment, and with reference to FIG. 7 to indicate layers and sublayers, a similar machine produces a first absorber sublayer 628 of CIGS enriched in gallium and depleted in indium, this sublayer is laid over a molybdenum back-contact layer 624 on a polyimide substrate 622. Three additional sublayers 630, 632, 634 of CIGS are then laid down, with each successive sublayer decreasing in gallium and increasing in indium concentrations with respect to the prior sublayer, such that sublayer 634 has the highest ratio of indium to gallium of all the sublayers. Next, a final Ib-IIIb-VIb sublayer of AIGS 636 (silver-indium-gallium-selenide) is deposited and alloyed, the CIGS 628, 630, 632, 634 and AIGS 636 sublayers forming a p-type solar absorber layer having composition tapering from gallium-rich to indium rich from back contact to the junction, and having a silver-rich junction while much of the bulk absorber has a Ib element of copper. Next, a heterojunction partner layer 638 of cadmium sulfide (CdS) and a buffer layer 639 of zinc oxide are deposited, with an indium-tin-oxide (InSnO) transparent conductor layer 640, a metallic top contact 642, and a protective layer 644 are deposited. A cell having this structure was found to have a 10.5% efficiency and effective bandgap of 1.32 electron-volts. The resulting solar absorber layer therefore comprises gallium and indium and has a composition graded such that portions of the absorber layer near the back contact layer are enriched in gallium and depleted in indium relative to portions of the absorber layer near the heterojunction partner layer. The solar absorber layer is also graded in silver content such that portions of the absorber layer near the heterojunction partner layer have substantially higher silver content than portions near the back contact layer. The gradients of silver, gallium, tellurium, or other elements content across the final absorber layer may, however, be somewhat less steep than the concentration differences between sublayers as deposited because a portion of the various Ib-IIIb-VIb elements may blend by diffusion across sublayer boundaries during the anneals performed by the heaters or lasers that serve as annealing energy sources in the machine of FIGS. 3C and 6.

Figure 7:
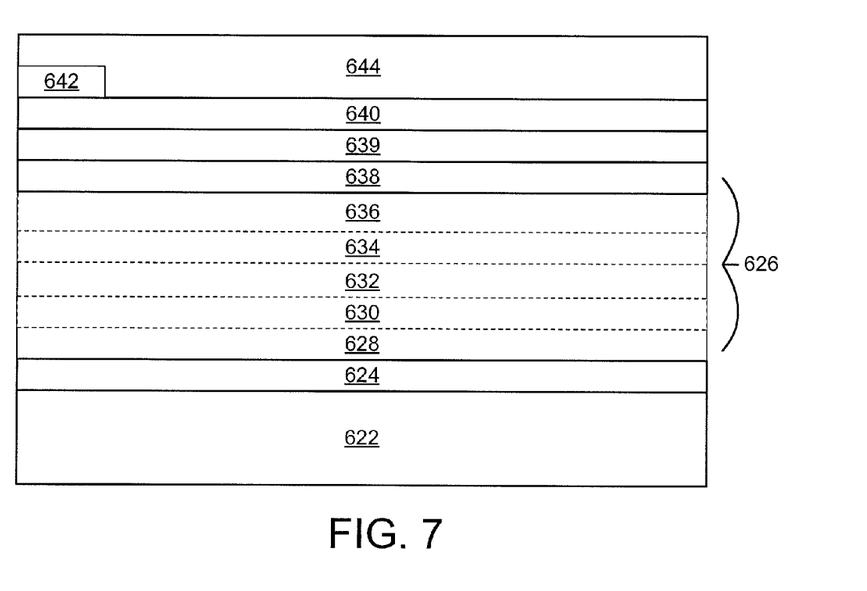
FIG. 7 is an illustration of a photovoltaic device produced by the segmented machine, the device having a solar absorber with five sublayers.

In an alternative embodiment, all absorber sublayers 628, 630, 632, 634 and 636 were constructed of an ACIGS material having a silver to silver plus copper ratio of between 0.4 and 0.8, and in a particular embodiment approximately 0.6. The ACIGS material was, however, graded in gallium and indium content, with the lowest sublayer 628 having a substantially higher ratio of gallium to gallium plus indium than upper sublayer 636, with intermediate sublayers 630, 632, 634 having intermediate ratios of gallium to gallium plus indium. Next, a heterojunction partner layer 638 of cadmium sulfide (CdS) and a buffer layer 639 of zinc oxide are deposited, with an indium-tin-oxide (InSnO) transparent conductor layer 640, a metallic top contact 642, and a protective layer 644 are deposited. A cell having this structure, with a silver to silver plus copper ratio of 0.6, was found to have a 13.2% efficiency and a bandgap of 1.4 electron volts.

In an alternative embodiment, first absorber sublayer 628 is constructed of a CIAT (copper-indium-aluminum-telluride) material, or in a variation an ACIAT (silver-copper-indium-aluminum-telluride) material; where aluminum substitutes for some or all of the group-Mb elements gallium and indium of CIGS. Similarly, in this alternative embodiment, tellurium substitutes for some or all of the group-VIb element selenium. In this embodiment, following sublayers 630, 632, 634 and 636 are constructed of an ACIGS material having a silver to silver plus copper ratio of between 0.4 and 0.8, and in a particular embodiment approximately 0.6; and between which the gallium to gallium plus indium ratio may in some variations also be graded from sublayer to sublayer. In a particular variation of this embodiment, the first sublayer 630 following CIAT sublayer 628 may contain some aluminum as well as indium and gallium to provide a blended gradient of aluminum concentration in those portions of the final absorber layer that are near the back contact 624. The final absorber layer therefore has a graded composition with substantially higher aluminum and tellurium concentrations in those portions of the absorber layer that lie near back contact layer 624 relative to portions lying near heterojunction partner layer 636, and the absorber layer has substantially higher selenium and indium concentrations near heterojunction partner layer 638 than near back contact layer 624.

In yet another alternative embodiment, first absorber sublayer 628 is constructed of a CIAT (copper-indium-aluminum-telluride) material; where aluminum substitutes for some or all of the group-IIIb elements gallium and indium of CIGS, and tellurium substitutes for some or all of the group-VIb element selenium. In this embodiment, intermediate sublayers 630, 632, 634 are constructed of a CIGS material, and final sublayer 636 of an ACIGS material having a silver to silver plus copper ratio of between 0.4 and 0.8, and in a particular embodiment approximately 0.6; in a variation of this embodiment the gallium to gallium plus indium ratio may in some variations also be graded from sublayer to sublayer of intermediate sublayers 630, 632, 634. In this embodiment, the final absorber layer therefore contains tellurium, with a substantially higher tellurium concentration in portions of the absorber layer that lie near the back contact layer 624 than in portions near the heterojunction layer 638, and silver, with a substantially higher silver concentration in portions of the absorber layer that lie near the heterojunction layer 638 than in portions near the back contact layer 624.

In yet another alternative embodiment, the first sublayer 628 is laid down comprising copper, aluminum, and tellurium, and in variations may also contain small amounts of indium and selenium. Subsequent sublayers 630, 632, 634 have successively decreasing concentrations of aluminum with increasing concentrations of indium as group IIIb elements, and may comprise selenium as the group VIb element with successively decreasing or zero concentrations tellurium, Similarly, subsequent sublayers 630, 632, and 634 may have some silver as group Ib elements in addition to or in place of the copper. The final sublayer 636 is laid down with primarily silver, indium and selenium, and may in variations contain zero or small concentrations of gallium and copper. With this embodiment, the final annealed absorber layer has group IIIb composition graded from high in aluminum near the back contact layer to a much lower aluminum, and much higher indium, concentration near the heterojunction layer 638. Similarly, the final annealed absorber layer has group VIb composition graded from high in tellurium near the back contact layer to a substantially lower tellurium, and much higher selenium, concentration near the heterojunction layer 638. The final annealed absorber layer also has group Ib composition graded from high in copper near the back contact layer to a much lower copper, and much higher silver, concentration near the heterojunction layer 638. In a particular embodiment, the final annealed absorber layer, if it contains any gallium, contains less than five percent gallium.

Changes may be made in the above methods and systems without departing from the scope hereof. It should thus be noted that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall there between.

The invention claimed is:

1. A photovoltaic device comprising a flexible substrate, a molybdenum back-contact layer, a Ib-IIIb-VIb solar absorber layer, a heterojunction partner layer, a buffer layer, a transparent top contact layer, and a metallic top contact, wherein the solar absorber layer comprises gallium and indium, copper, selenium, silver, and tellurium and has a composition graded such that portions of the absorber layer near the back-contact layer are enriched in tellurium and depleted in selenium relative to portions of the absorber layer near the heterojunction partner layer;

wherein the solar absorber layer has composition graded such that portions of the absorber layer near the back-contact layer are enriched in copper and depleted in silver relative to portions of the absorber layer near the heterojunction partner layer.

2. The photovoltaic device of claim 1 wherein the solar absorber layer has composition graded in ratio of gallium to indium such that portions of the absorber layer near the back-contact layer have a different ratio of gallium to indium relative to portions of the absorber layer near the heterojunction partner layer.

3. A photovoltaic device comprising a flexible substrate, a molybdenum back-contact layer, a Ib-IIIb-VIb solar absorber layer, a heterojunction partner layer, a buffer layer, a transparent top contact layer, and a metallic top contact, wherein the solar absorber layer comprises gallium and indium, copper, selenium, silver, and tellurium and has a composition graded such that portions of the absorber layer near the back-contact layer are enriched in tellurium and depleted in selenium relative to portions of the absorber layer near the heterojunction partner layer;

wherein the solar absorber layer further comprises aluminum, and has composition graded in aluminum concentration such that portions of the absorber layer near the back-contact layer have substantially higher aluminum content relative to portions of the absorber layer near the heterojunction partner layer.

4. A photovoltaic device comprising a flexible substrate, a molybdenum back-contact layer, a Ib-IIIb-VIb solar absorber layer, a heterojunction partner layer, a buffer layer, a transparent top contact layer, and a metallic top contact, wherein the solar absorber layer comprises at least aluminum, indium, selenium, and silver, and has a composition graded such that portions of the absorber layer near the back-contact layer are enriched in aluminum and depleted in indium relative to portions of the absorber layer near the heterojunction partner layer;

wherein the solar absorber layer further comprises copper, and has composition graded in ratio of copper to silver such that portions of the absorber layer near the back contact layer have a higher ratio of copper to silver than portions of the absorber layer near the heterojunction partner layer.

5. The photovoltaic device of claim 4, wherein the solar absorber layer further comprises tellurium, and has composition graded in ratio of tellurium to selenium such that portions of the absorber layer near the back-contact layer have a higher ratio of tellurium to selenium than portions of the absorber layer near the heterojunction partner layer.

\* \* \* \* \*

UNITED STATES PATENT AND TRADEMARK OFFICE
CERTIFICATE OF CORRECTION

PATENT NO. : 8,648,253 B1  
APPLICATION NO. : 12/899446  
DATED : February 11, 2014  
INVENTOR(S) : Woods et al.

Page 1 of 1

It is certified that error appears in the above-identified patent and that said Letters Patent is hereby corrected as shown below:

In the Specification

Column 3, Line 10, "an semiconductor" should read --an I-III-VI semiconductor--;
Column 4, Line 28, "of materials" should read --of I-III-VI materials--;
Column 5, Line 49, "foamed" should read --formed--;
Column 6, Lines 39 to 40, "IB-IIB-VIB" should read --IB-IIIB-VIB--; Line 41, "254 256 258" should read --254, 256, 258--; Line 60 to 61, "or another material" should read --or another I-III-VI material--;
Column 8, Line 61 to 62, "the elements" should read --the I-III-VI elements--;
Column 10, Line 30, "JIB" should read --IIB--;
Column 12, Line 31, "group-Mb" should read --group-IIIB--;
Column 13, Line 10, "group-Mb" should read --group-IIIB--; Line 12 to 13, "tellurium, Similarly," should read --tellurium. Similarly,--; Line 19, "group-Mb," should read --group-IIIB--.

Signed and Sealed this  
First Day of July, 2014

Michelle K. Lee  
*Deputy Director of the United States Patent and Trademark Office*